United States Patent
Chuang et al.

(10) Patent No.: US 6,989,306 B2
(45) Date of Patent: Jan. 24, 2006

(54) TERMINATION STRUCTURE OF DMOS DEVICE AND METHOD OF FORMING THE SAME

(75) Inventors: Chiao-Shun Chuang, Hsinchu (TW); Hsin-Huang Hsieh, Hsinchu (TW); Mao-Song Tseng, Hsinchu (TW); Chien-Ping Chang, Hsinchu (TW)

(73) Assignee: Mosel Vitelic, Inc., Hsinchu (TW)

( * ) Notice: Subject to any disclaimer, the term of this patent is extended or adjusted under 35 U.S.C. 154(b) by 129 days.

(21) Appl. No.: 10/771,808

(22) Filed: Feb. 3, 2004

(65) Prior Publication Data
US 2005/0009277 A1    Jan. 13, 2005

(30) Foreign Application Priority Data
Mar. 11, 2003    (TW) ............................... 92105250 A

(51) Int. Cl.
H01L 21/336    (2006.01)
(52) U.S. Cl. ...................................... 438/270; 438/589
(58) Field of Classification Search .................... None
See application file for complete search history.

(56) References Cited
U.S. PATENT DOCUMENTS 5,316,959 A * 5/1994 Kwan et al. ................. 438/270
5,468,982 A * 11/1995 Hshieh et al. ............... 257/331
5,578,512 A   11/1996 Tao
5,904,525 A * 5/1999 Hshieh et al. ............... 438/272
5,981,999 A   11/1999 Liu
6,472,722 B1  10/2002 Ho et al.
6,884,683 B2 * 4/2005 Hshieh et al. ............... 438/268

* cited by examiner

Primary Examiner—Chandra Chaudhari
(74) Attorney, Agent, or Firm—Townsend and Townsend and Crew LLP

(57) ABSTRACT

Embodiments of the invention provide a termination structure of DMOS device and a method of forming the same. In forming the termination structure, a silicon substrate with an epitaxial layer formed thereon is provided. A body region defined by doping the epitaxial layer is then selectively etched to form a plurality of DMOS trenches therein. Thereafter, a gate oxide layer is formed over exposed surfaces in the body region and a termination oxide layer is formed to encircle the body region. Afterward, a polysilicon layer is deposited over all the exposed surfaces, and then selectively etched to form a plurality of poly gates in the DMOS trenches and a polysilicon plate having an extending portion toward the body region over the termination oxide layer. By using the termination polysilicon layer as an implantation mask, sources are formed in the body region. Afterward, an isolation layer and a source metal contact layer are deposited over the structure, in which the isolation layer is utilized to protect the polysilicon gates, and also the source metal contact layer is utilized to ground both the body region and the polysilicon plate.

18 Claims, 18 Drawing Sheets

TERMINATION STRUCTURE OF DMOS DEVICE AND METHOD OF FORMING THE SAME

This application claims priority from R.O.C. patent application No. 092105250, filed Mar. 11, 2003, the entire disclosure of which is incorporated herein by reference.

BACKGROUND OF THE INVENTION

This invention relates to a termination structure, and more particularly relates to a termination structure for a DMOS device as well as a method for forming the same.

A diffused metal-oxide-semiconductor (DMOS) transistor is an important power transistor device and is widely used in power suppliers and power control devices for high-voltage systems. Among many published power transistor structures, a trenched power transistor is a noble design and some reports indicate that it has better performance than a planar power transistor in efficiency and pattern density.

A typical fabrication method for forming a trenched DMOS is shown in FIG. 1A through FIG. 1F. In FIG. 1A, an N-type epi layer 10 is formed on an N+-type silicon substrate 1, and then a thermal oxidation process is performed to form a termination oxide layer 20 over a location of a termination structure. The termination oxide layer 20 is utilized as a mask for a P-type doping to form a P-type active area 12. In FIG. 1B, the P-type active area 12 is etched to form a plurality of DMOS trenches 13 extending through the P-type body 12 down to the N-type epi layer 10. Afterward, an oxidation process is performed to form a gate oxide layer 21 over the active area 12 and also to grow the termination oxide layer 20 to become a field oxide layer 22. In FIG. 1C, a polysilicon layer is formed by a chemical vapor deposition (CVD) process and then etched to remove polysilicon on the surface of the epi layer 10 around the DMOS trenches 13. A polysilicon gate 30 then is formed in each DMOS trench. In FIG. 1D, a lithographic process is performed to define locations of source regions 40. Using a photoresist layer 40PR on the source regions 40, N-type dopants are implanted into the active area 12 to form N+-type source regions 40 surrounding the DMOS trenches 13. In FIG. 1E, an isolation layer 50 is formed by a CVD process. An etch is performed to form a plurality of body contact windows 51 over the N+-type source regions 40. Moreover, P-type dopants are implanted into the body contact windows to form doped regions 41 surrounding the source regions. In FIG. 1F, a source metal contact layer 60 is deposited over the isolation layer 50. The source metal contact layer 60 connects with the active area 12 through the body contact windows 51. The source metal contact layer 60 has contact windows to expose the isolation layer 50. In addition, a drain metal contact layer 61 covers the backside of the N-type silicon substrate 1. With a voltage applied on the polysilicon gate, it can show whether the source regions of the DMOS trenches are conductive to the drain regions.

A trenched power transistor performs better than a planar power transistor. However, the structure of a trenched power transistor is more complex than that of a planar power transistor. Therefore, reducing the number of lithographic process steps is one way of improving the manufacturing process.

For the abovementioned lithographic process, the process improvement focuses on canceling the lithographic steps for the source region implantation and polysilicon layer deposition. As shown in FIG. 2, N-type dopants are directly implanted without a mask (not shown) which is used for forming a source region photoresist 40PR and defining the scope of implantation of a source region 40 as a source region mask. The silicon substrate 1 is masked by the field oxide layer 22 and the polysilicon gates 30, so that a small gap is formed having the horizontal width w (marked as A) between the N-type doped area 40a and the N-type epi layer 10 on the P-type active area 12. Punch-through occurs easily in the location A on the P-type active area 12 and leads to breakdown of the transistor.

To avoid the effects of electrostatic discharge on power transistors, an ESD (Electrostatic Discharge) protective circuit 14 is usually utilized in the IC design. A typical ESD 14 is shown in FIG. 3. It is noted that, to form a polysilicon layer 32, a mask is needed to define the location of the ESD polysilicon layer 32. As a consequence, the lithographic process related to the polysilicon layer deposition cannot be neglected usually.

In addition, because the power transistor device is usually utilized under a higher electric voltage, a termination structure should be added thereto for avoiding early breakdown and current leakage. In the art, various structures such as a local oxidation of silicon (LOCOS), a field plate, a guard ring or the like can be utilized as the termination structure. In particular, the LOCOS structure is well known for its simple fabrication process.

In the typical trenched DMOS device as shown in FIG. 1B, the field oxide layer 22 is utilized as the main body of the termination structure. However, due to the process characteristics of the field oxide layer 22, the electric field crowding around the active area 12 is improved with limitation. The better result can be reached by combining some other termination structures such as a field plate, for example.

Referring to FIG. 4A, a typical field plate 16 is shown. The field plate is a conductive layer over the oxide layer, and is typically made of polysilicon or metal. When the field plate 16 is applied with a negative bias, positive charges are formed under the field plate 16 thereof so as to extend the boundary of the depletion region of P-N junction from 15 to 15'. On the other hand, when the field plate 16 is biased positively, to the boundary will move from 15 to 15". In FIG. 4B, a planar P-N junction is shown, connected with an electric plate 16 and having a boundary 15 of the depletion region of the planar P-N junction. The electric field crowding effect near the junction surface 161 can be improved by applying a negative bias on the field plate 16.

BRIEF SUMMARY OF THE INVENTION

The present invention discloses a termination structure to not only meet the requirement of the reduction of the source region mask, but also provide the advantages of the abovementioned field oxide and electric plate.

Embodiments of the present invention provide a DMOS device with a termination structure and a method for forming the same. First, an epi layer doped with first conductive dopants is formed on an N+ silicon substrate highly doped with the first conductive dopants. Then, a termination oxide layer is formed over the surface of the epi layer to be a mask of an active area of the DMOS device by lithographic and etching technologies. With the mask, second conductive dopants are implanted to define the active area. Then, a plurality of DMOS trenches extending from the bottom of the active area is formed in the active area by an etching process. Thereafter, a thermal oxidation process is performed to form a gate oxide layer over the active area. Meanwhile, the termination oxide layer grows to become a field oxide layer.

A polysilicon layer is deposited by a CVD process. A plurality of poly gates and a polysilicon layer of a termination structure, located on the field oxide layer and extending to the top of adjacent DMOS trenches. With the polysilicon layer of the termination structure and the field oxide layer as a mask, the first conductive dopants are implanted directly to form first conductive doped regions. An isolation layer is formed. Lithographic and anisotropic etching processes are performed to form a plurality of contact windows of the active area over the first conductive doped regions and a first contact window on the polysilicon plate. Thereafter, using the isolation layer as a mask, second conductive dopants are implanted to form a plurality of first conductive source regions and a plurality of the second conductive highly-doped contact regions surrounding the source regions. Finally, a metal layer is deposited. A portion of the metal layer over the termination area is removed to form a metal contact layer for the source regions with lithographic and etching processes. The metal contact layer for the source regions is connected with the active area through the contact windows of the active area and connected with the polysilicon layer of the termination structure through the first contact window.

The polysilicon layer of the termination structure and the polysilicon gates are formed in the same etching process. The polysilicon layer of the termination structure can be used as a mask for the implantation of the first conductive dopants. Therefore, comparing to the prior art, the lithographic process for defining the source regions of the DMOS devices can then be eliminated in the present embodiment.

In addition, as the DMOS device made by the present embodiment is operated, capacitance is created between the polysilicon layer of the termination structure and the active area under that layer. It results in the extension of the depletion region of the P-N junction at the surface of the active area. It not only increases the horizontal distance between the first conductive source region of the DMOS device and the surface of the P-N junction, but also releases the electric field crowding beneath the field oxide layer to prevent from early-happening electric breakdown.

DETAILED DESCRIPTION OF THE INVENTION

Embodiments of the invention disclosed herein are directed to a termination structure of DMOS device and a method for forming the same. In the following description, numerous details are set forth in order to provide a clear understanding of the present invention. It will be appreciated by one skilled in the art that variations of these specific details are possible while still achieving the results of the present invention. In some cases, well-known components are not described in detail in order not to unnecessarily obscure the present invention.

The fabrication processes of a trenched DMOS and a termination structure thereof in accordance with the present embodiment are shown in a schematic sequence of FIG. 5A through FIG. 5F.

Figure 5A:
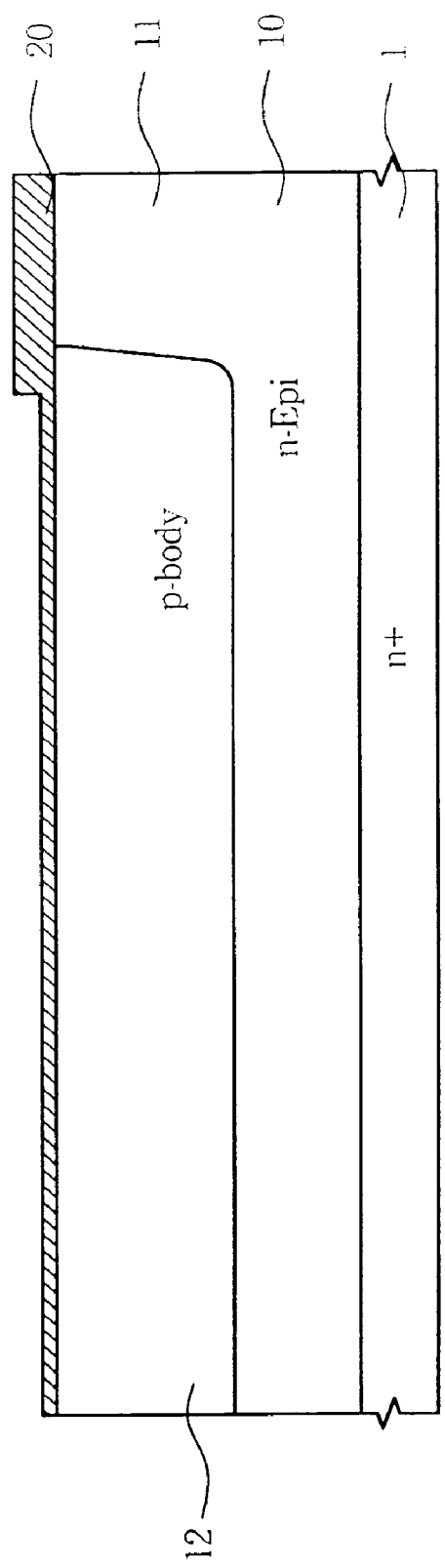
FIGS. 5A through 5E depict a sequence of steps to form a trenched DMOS in accordance with an embodiment of the present invention.

As shown in FIG. 5A, an N-type epi layer 10 is formed on an N+-type silicon substrate 1. Afterward, an oxide layer is formed over the top surface of the N-type epi layer 10. A lithographic process is used to define an active area 12 and a termination area 11 surrounding the active area 12. An etching step is performed to remove the oxide layer over the top surface of the active area 12. Then, a termination oxide layer 20 is formed over the termination area 11. Thereafter, a thermal oxidation process is performed to form a sacrificial oxide layer over all surfaces. The termination oxide layer 20 is used as a mask for an implantation process of P+-type dopants to form the active area 12.

Figure 5B:
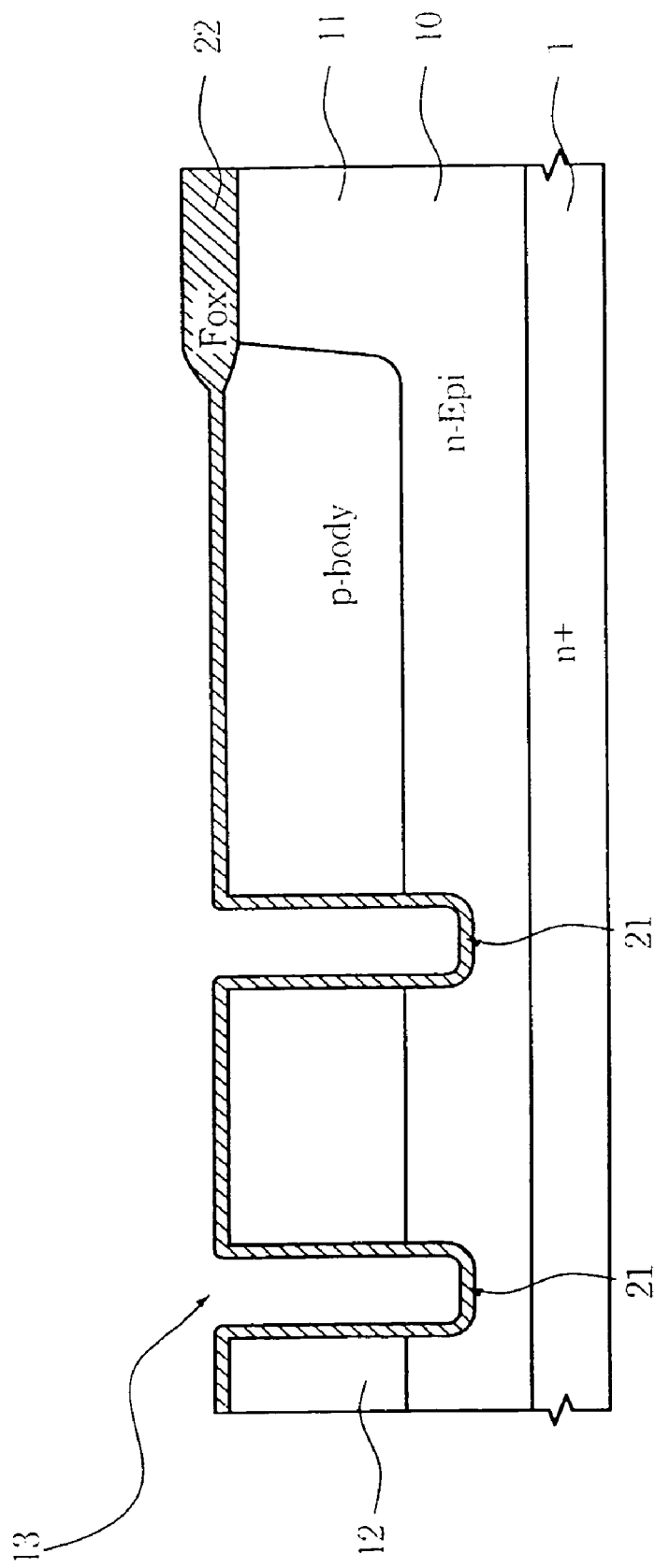

Afterward, as shown in FIG. 5B, a plurality of DMOS trenches 13 is formed by etching the active area 12. The bottom of a plurality of the DMOS trenches 13 is below the substrate of the active area 12. Then, the sacrificial oxide layer is removed by a blanket etching. A high temperature oxidation process is performed to form a gate oxide layer 21 over all surfaces of the active area 12, while a field oxide layer 22 is grown from the termination oxide layer 20.

Figure 5C:
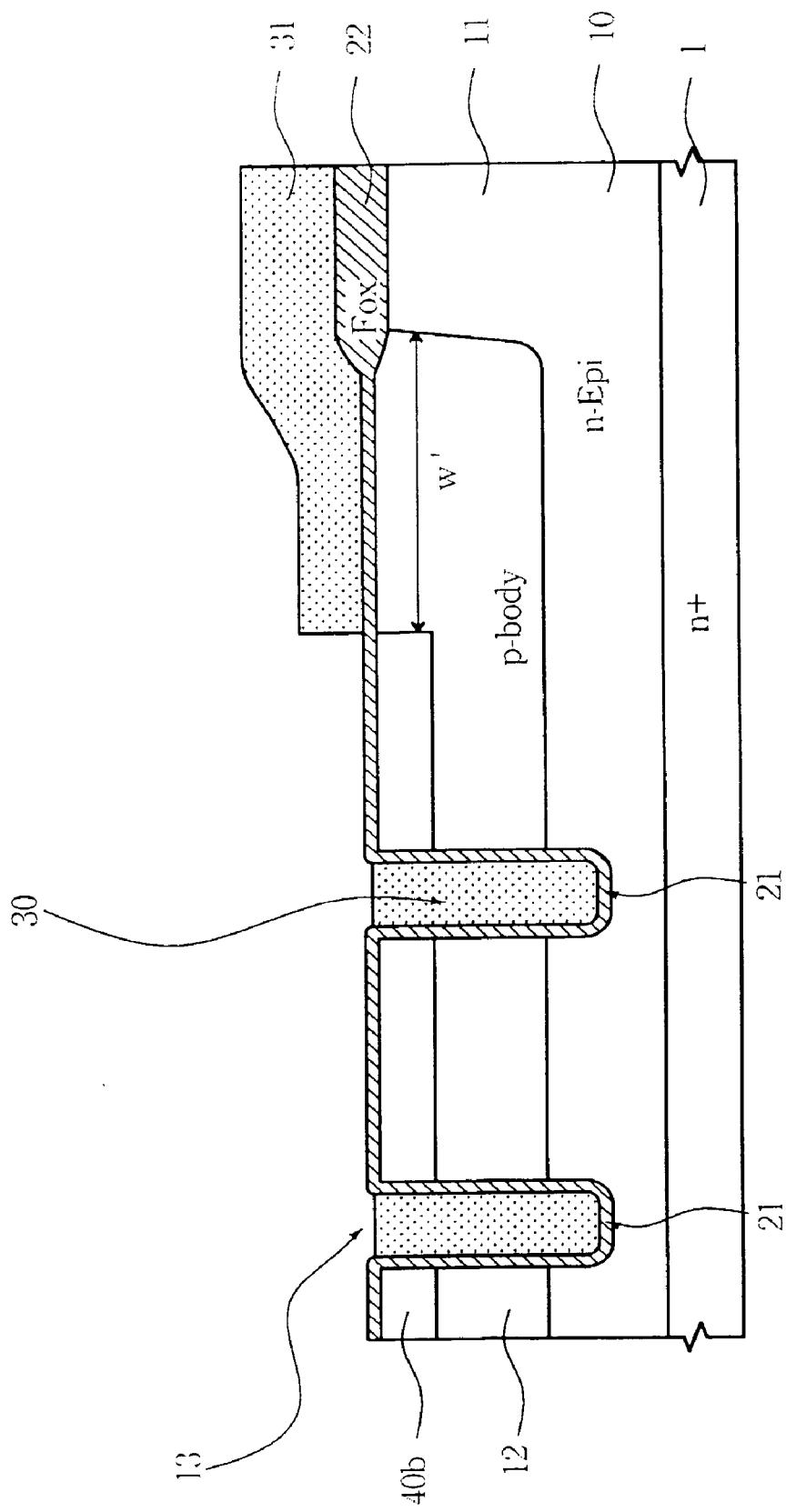

In FIG. 5C, a polysilicon layer is deposited, and lithographic and etching steps are used to remove a part of the polysilicon layer over the surface of the epi layer 10 and the field oxide layer 22 to form polysilicon gates 30 in the DMOS trenches 13 and a termination structure polysilicon layer 31 with an extending portion over the field oxide layer 22 extending to the active area at a certain distance. Then, by using the termination structure polysilicon layer 31 and the field oxide layer 22 as a mask, an implantation process is performed to form a N+-type region 40b between adjacent DMOS trenches.

Figure 5D:
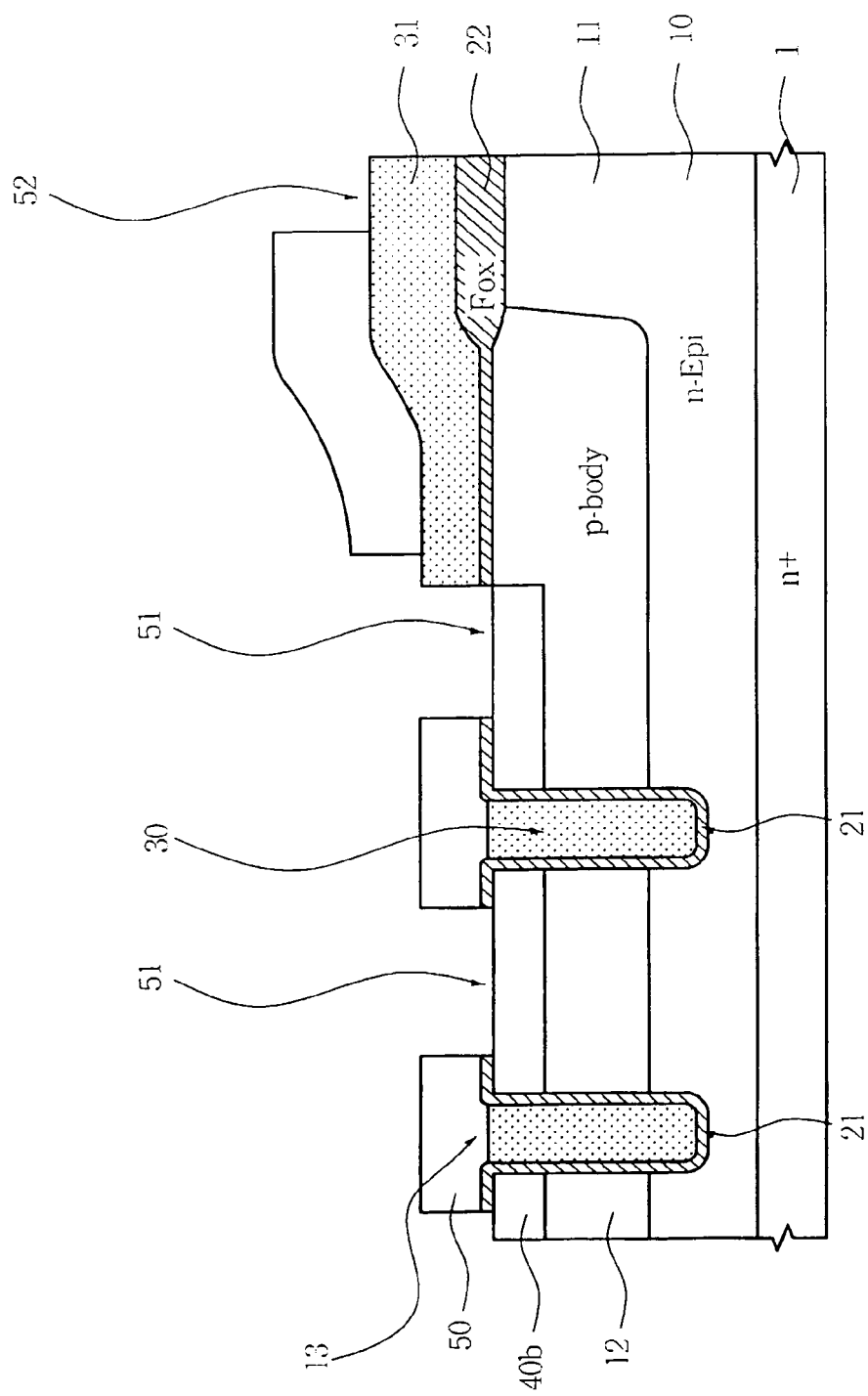
Figure 5E:
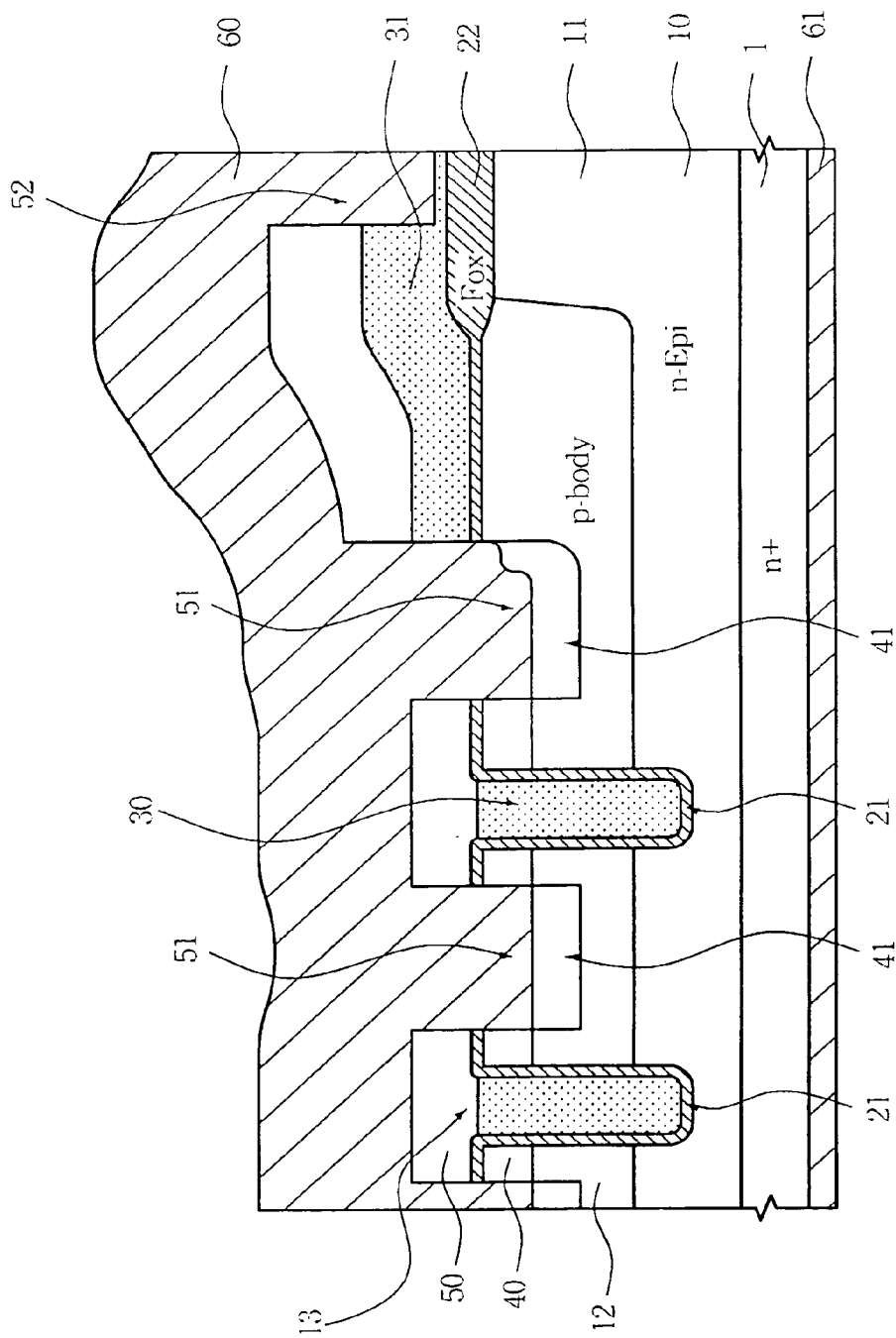

In FIG. 5D, an isolation layer 50 is formed. Then, by using lithographic and two-step anisotropic etching processes where the first-step etching is to remove the isolation layer 50 and the gate oxide layer 21, a plurality of contact windows 51 of the active area are formed over the N+-type region 40b and a first contact window 52 over the termination structure polysilicon layer 31. The second-step etching is shown in FIG. 5E. By using the isolation layer 50 as a mask, the exposed portions of the N+-type region 40b and the termination structure polysilicon layer 31 are etched and then removed. Then, an implantation process of P+-type dopants is performed directly to have sidewalls of the contact windows 51 of the active area adjoining to the sources 40 and also have the bottom adjoining to the P+-type regions 41.

Finally, a metal layer is deposited. Then, by using lithographic and etching processes to remove parts of the metal layer over the termination region 11, a metal contact layer 60 for the source regions is formed, which connects the N+-type source regions 40 and P+-type regions 41 through the contact windows 51 of the active area and also connects the first contact window 52 through the polysilicon layer 31 of the termination structure.

Subsequently, a chemical mechanical polishing (CMP) process is carried out to remove excess deposited layer on the backside of the silicon substrate 1, so that the backside is exposed. Then, a metal contact layer 61 of a drain region is deposited on the backside of the silicon substrate 1.

In some preferred embodiments, the isolation layer 50 may be silicate glass, and the metal contact layer 60 of the source regions may include a stack of Ti, TiN, and AlSiCu layers from down to up in sequence.

Figure 1A:
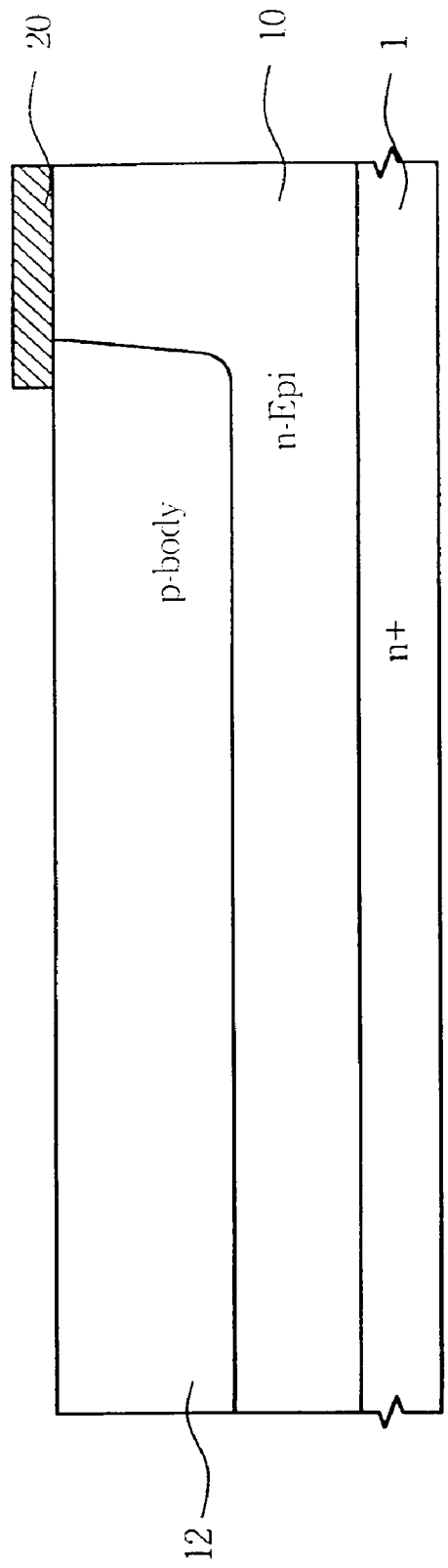
FIGS. 1A through 1F depict a sequence of steps to form a traditional trenched DMOS.
Figure 1B:
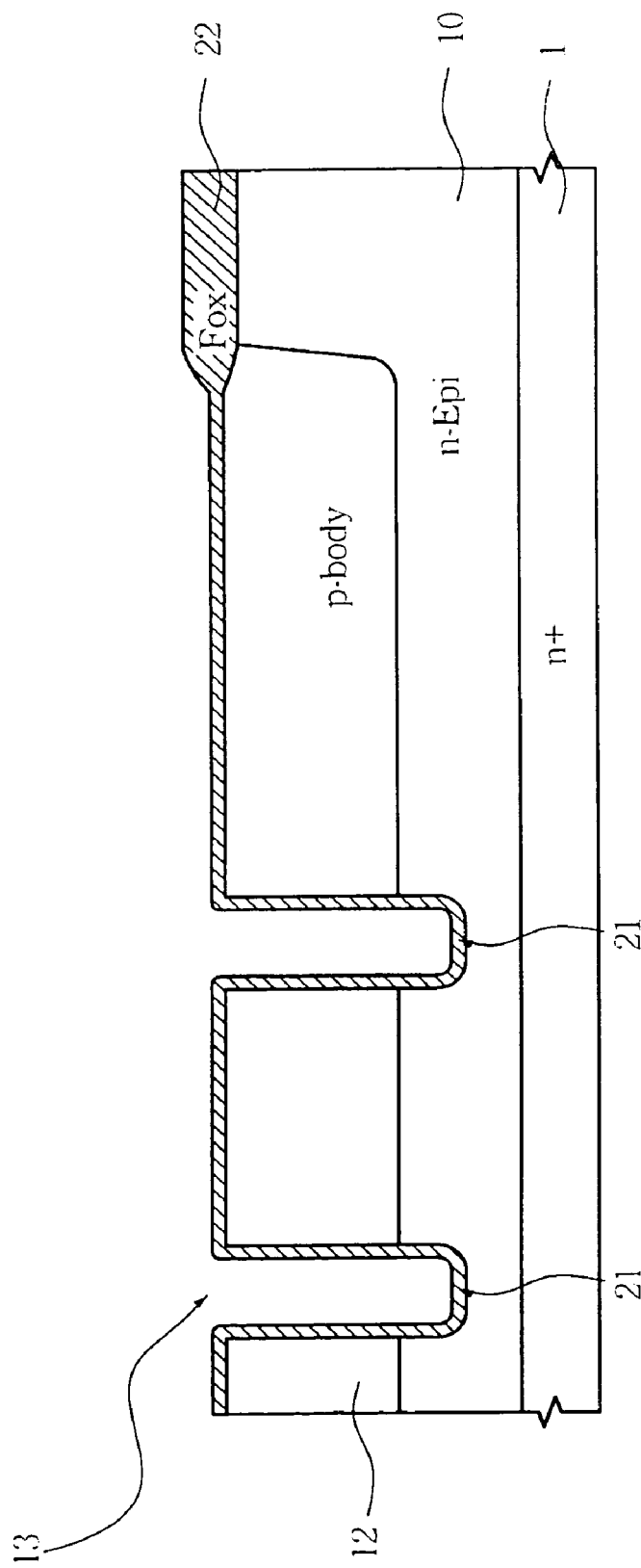
Figure 1C:
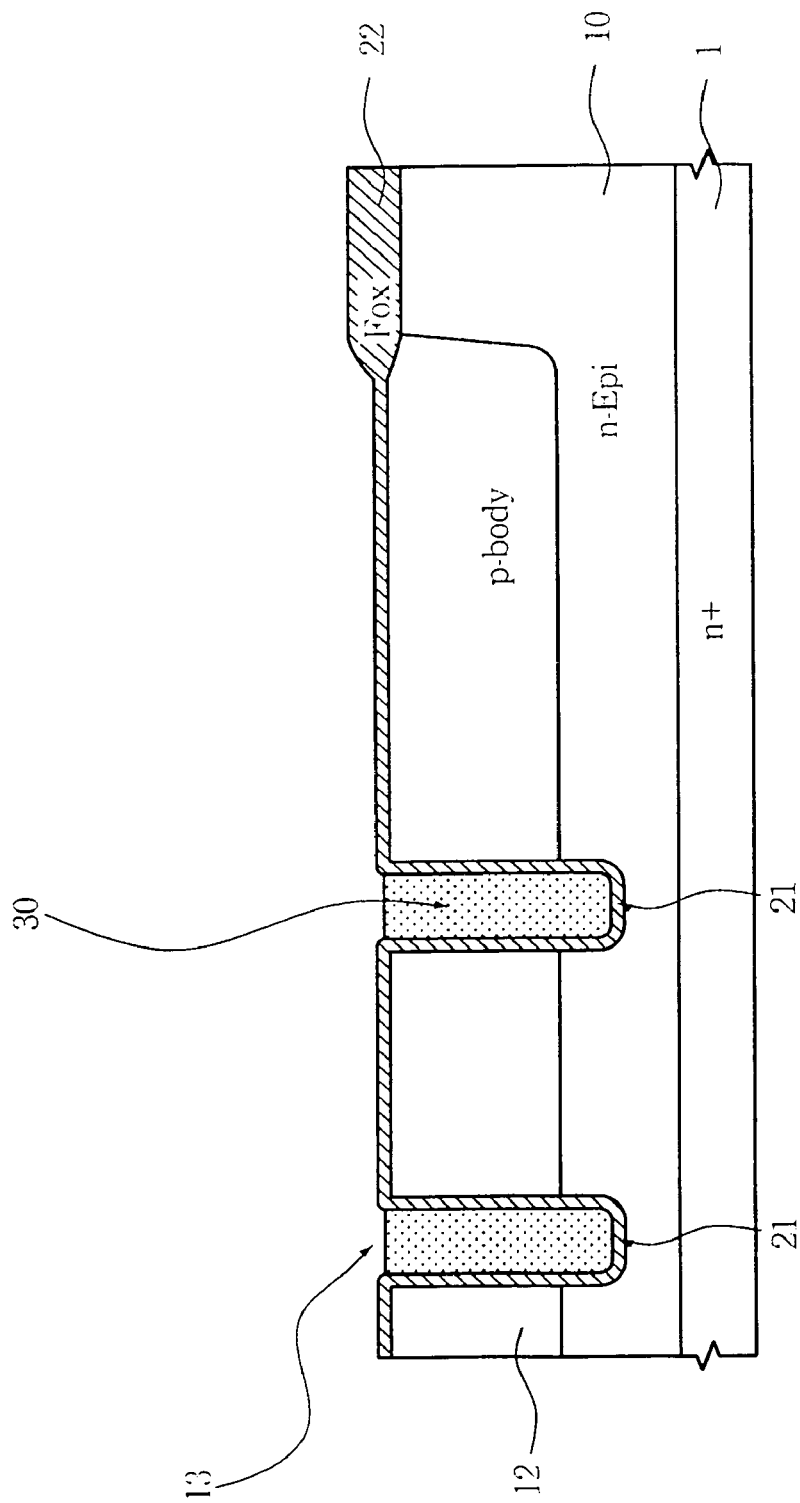
Figure 1D:
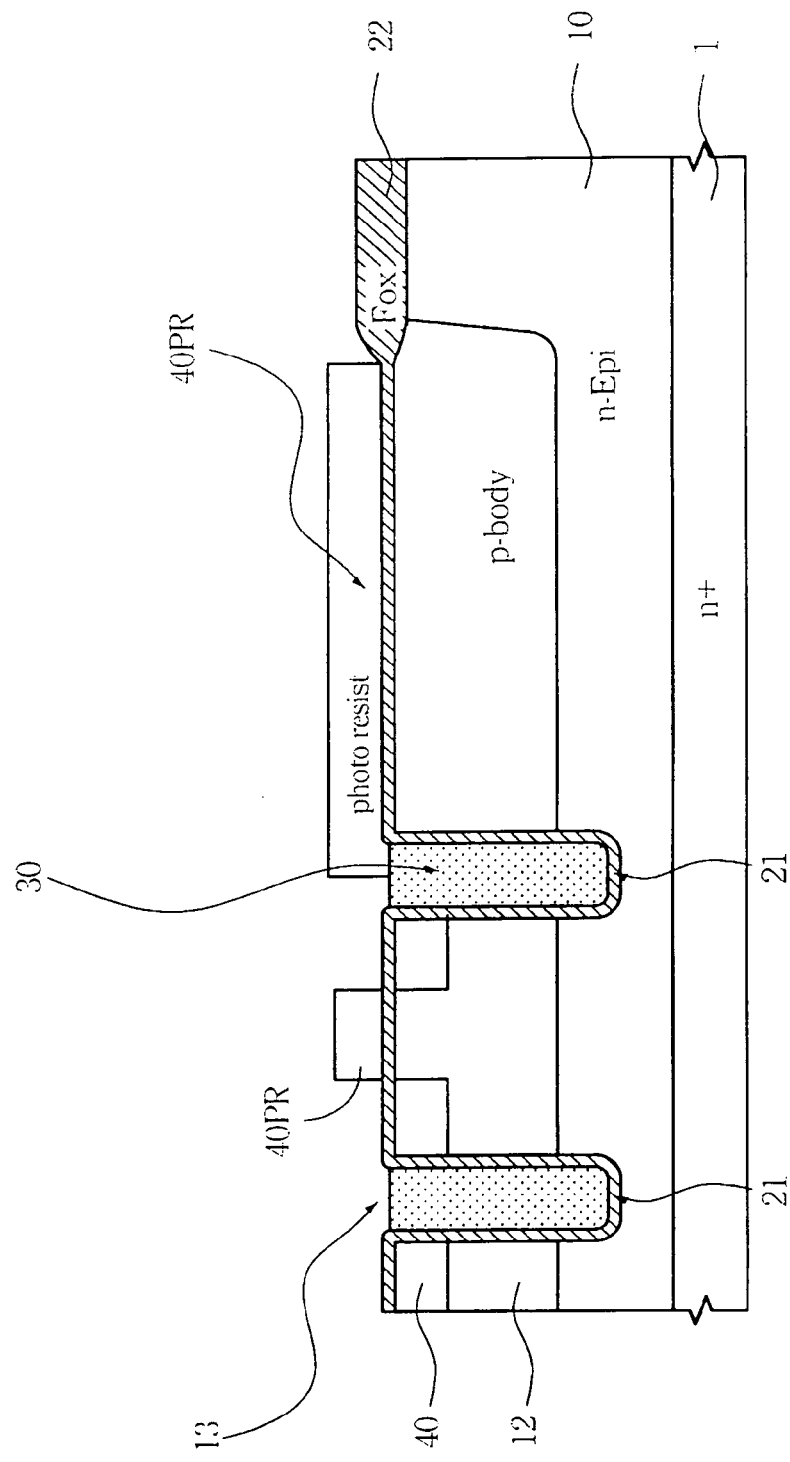
Figure 1E:
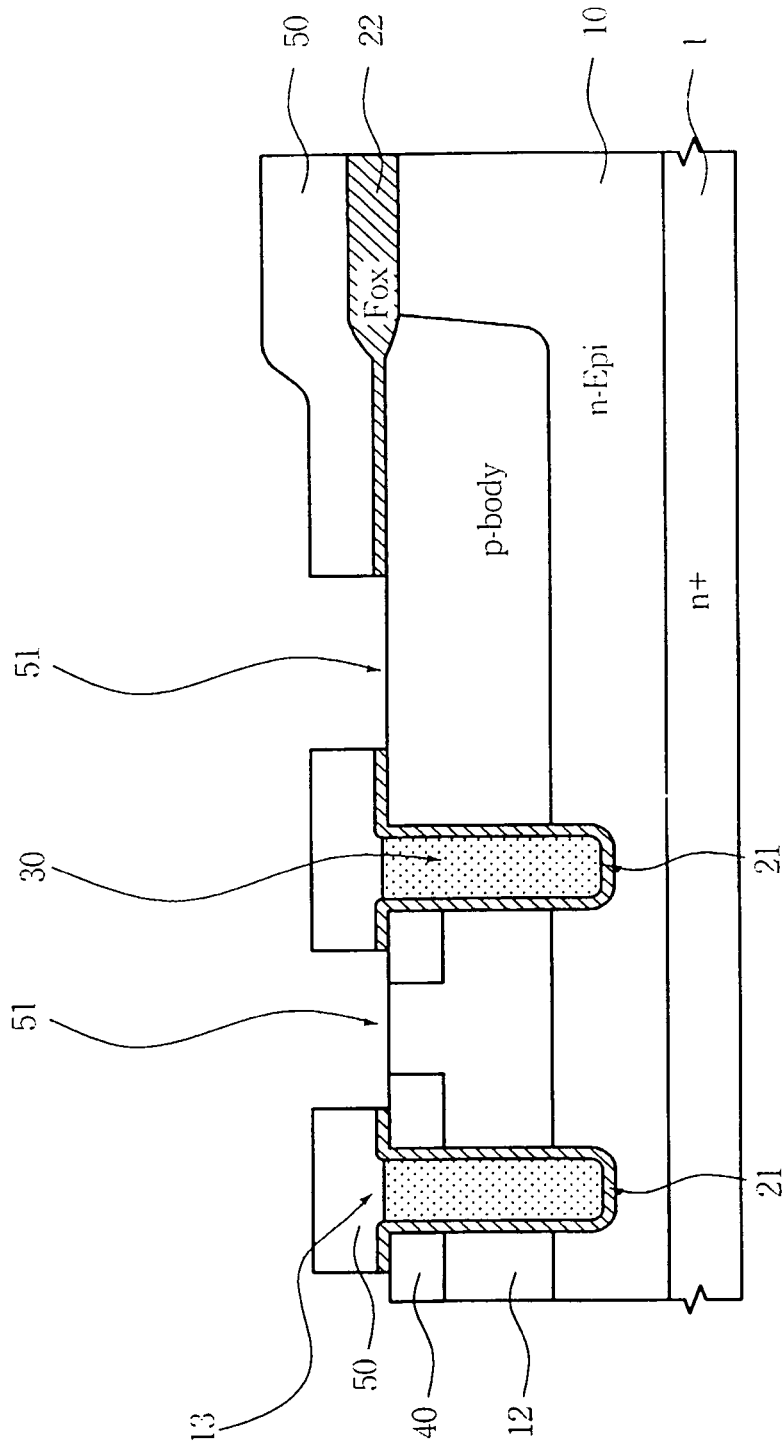
Figure 1F:
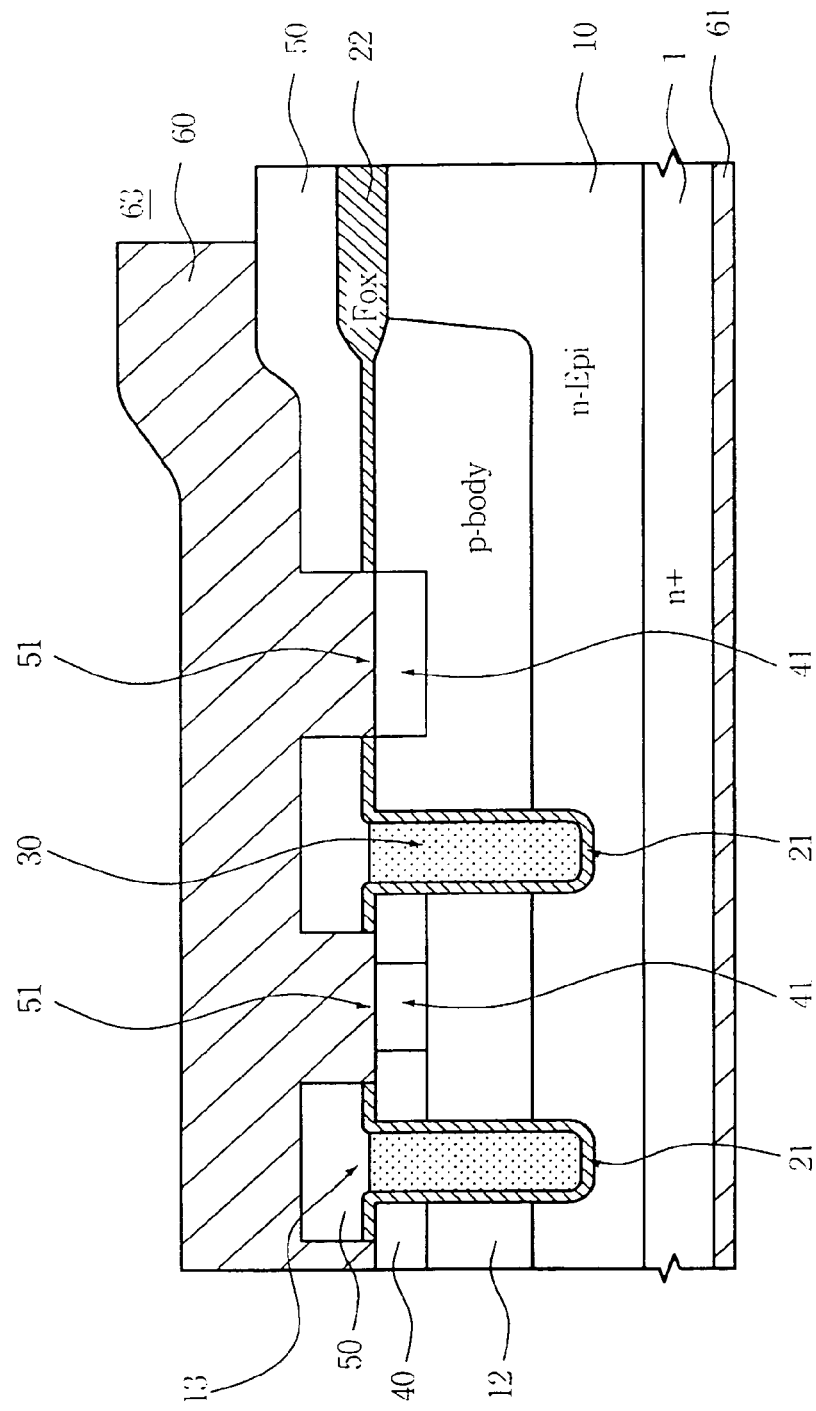
Figure 2:
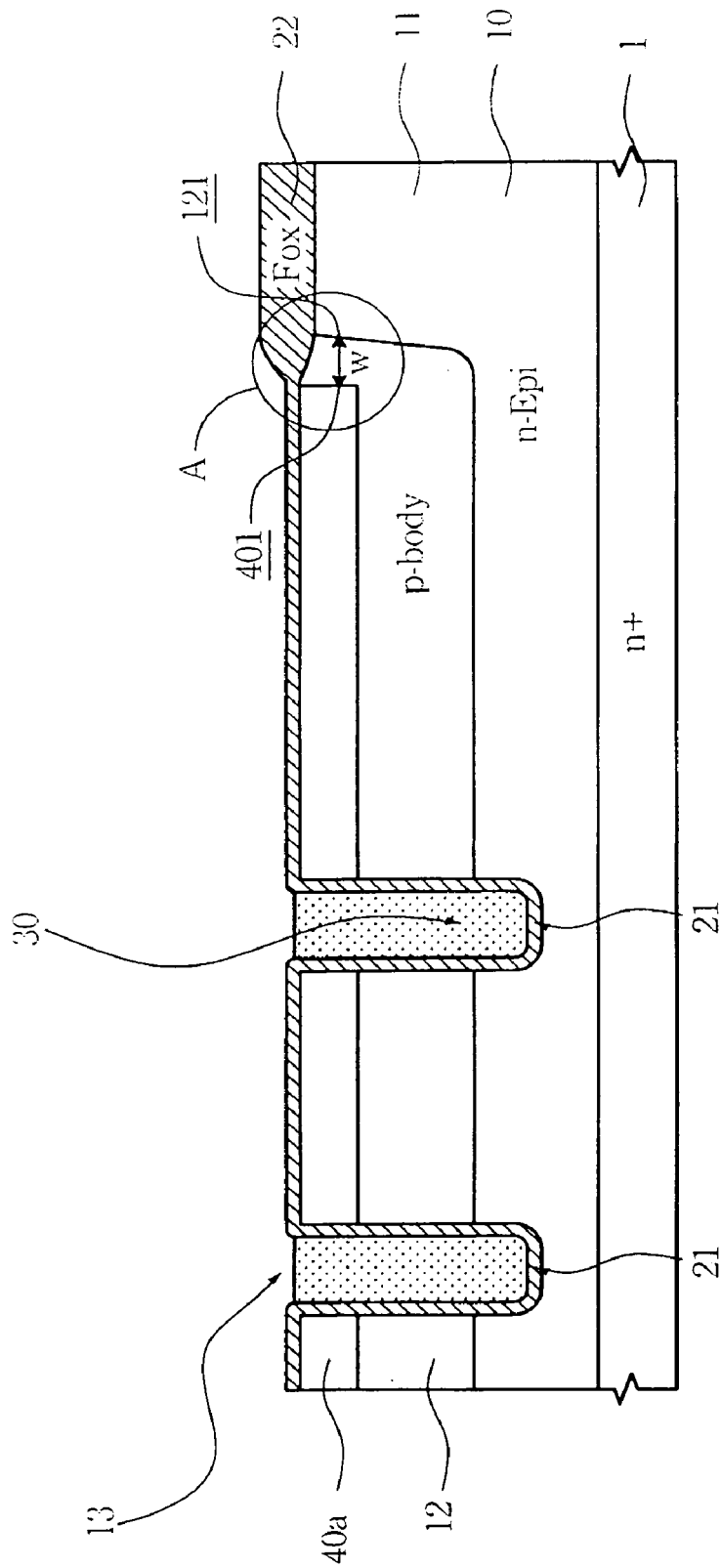
FIG. 2 is a schematic drawing of a step resembling that shown in FIG. 1B but eliminating the source mask.
Figure 3:
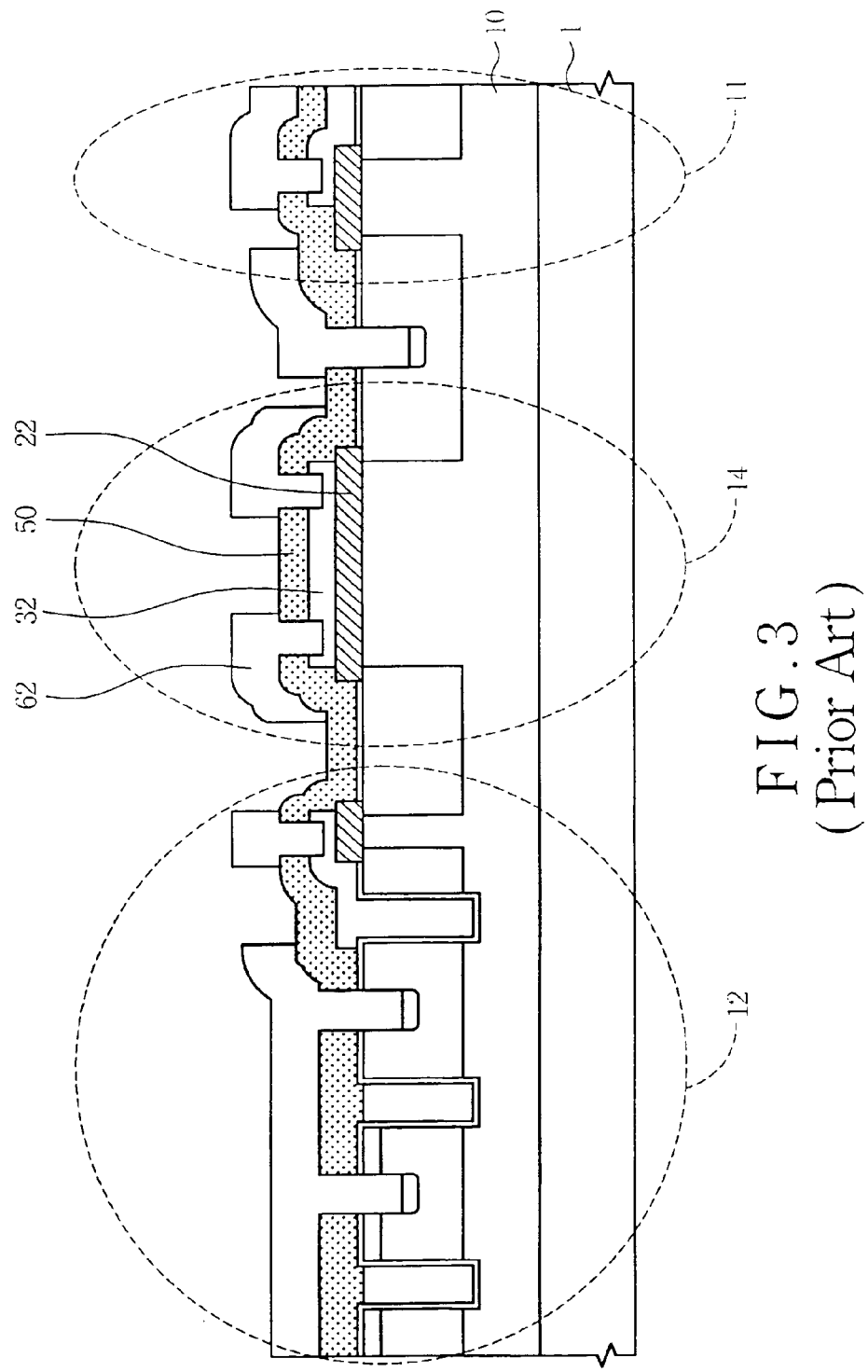
FIG. 3 depicts a cross-sectional view of a typical ESD device.
Figure 4A:
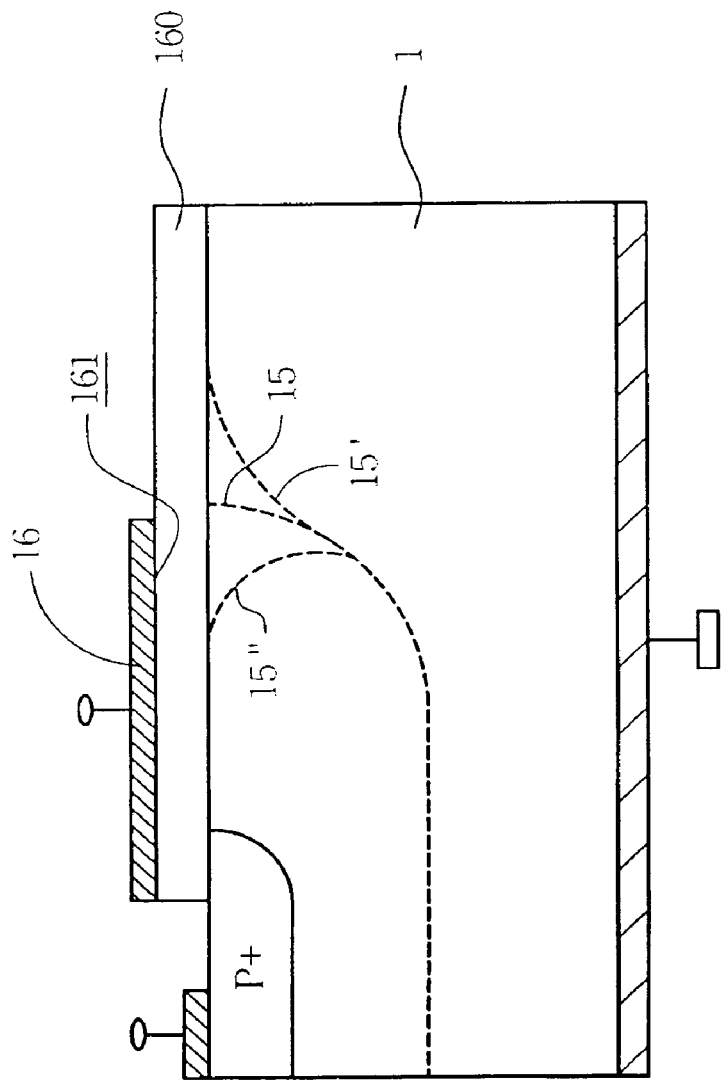
FIGS. 4A and 4B depict cross-sectional views of a traditional field plate.
Figure 4B:
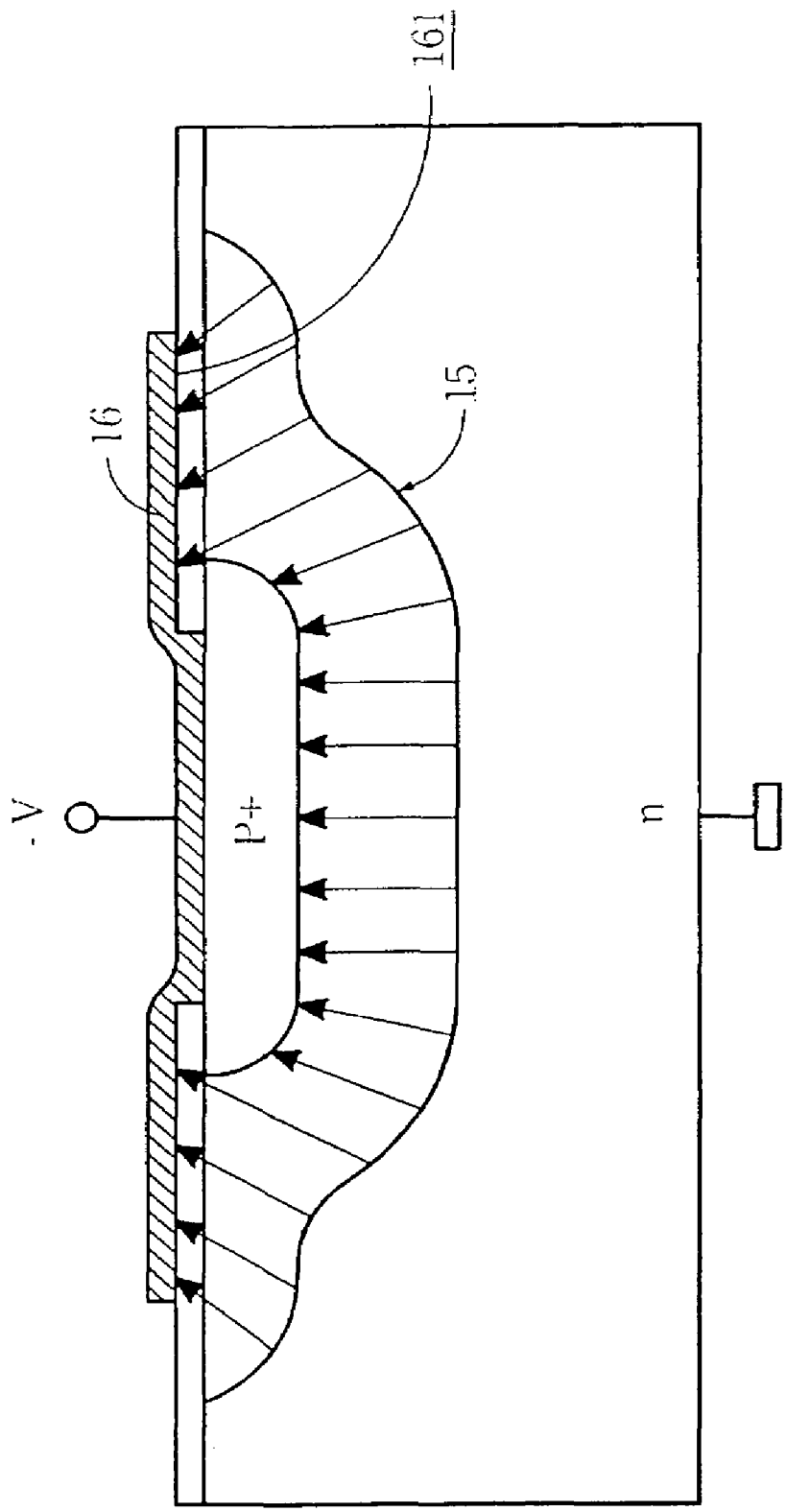

FIG. 1D, FIG. 2, and FIG. 5C are compared. As shown in FIG. 1D, a source region 40 is formed by a lithographic process. The distance between the source region 40 and the boundary of the active area 12 should remain a certain horizontal distance so as to avoid the punch through effect on the active area, happening between the source regions 40 and the N-type epi layer 10. However, if the source-region mask of the process in accord with FIG. 1D is eliminated as indicated by the location A shown in FIG. 2, the horizontal width w of the P-type active area 12 between the N+-type region 40a and the N-type epi layer 10 is too narrow, so that the P-type active area is easily punched through and it leads to electrical breakdown. Referring to FIG. 5C, by changing the pattern on the mask used for defining the polysilicon layer in accord with the present embodiment, a polysilicon layer 31 of the termination structure is formed during the etching process to form the polysilicon gates 30. The polysilicon layer 31 of the termination structure covers the termination oxide layer 20 and extends to the field oxide region 12 for a certain distance. Then, use the polysilicon layer 31 of the termination structure and the field oxide layer 22 as a mask to process the N-type implantation. Therefore, the horizontal width w of the P-type active area 12 between the N+-type region 40a and the N-type epi layer 10 increases to w' (w'>w). Thus, the problems of punch through effect and electrical breakdown shown in FIG. 2 can be avoided.

For a general power IC design, an ESD circuit 14 is included for protection. Therefore, the abovementioned mask for forming the polysilicon layer is necessary. Thus, the present embodiment is configured to change the pattern of the abovementioned mask to form the polysilicon layer 31 of the termination structure, so the source region mask used in FIG. 1D is saved. One lithographic process is omitted.

Figure 6:
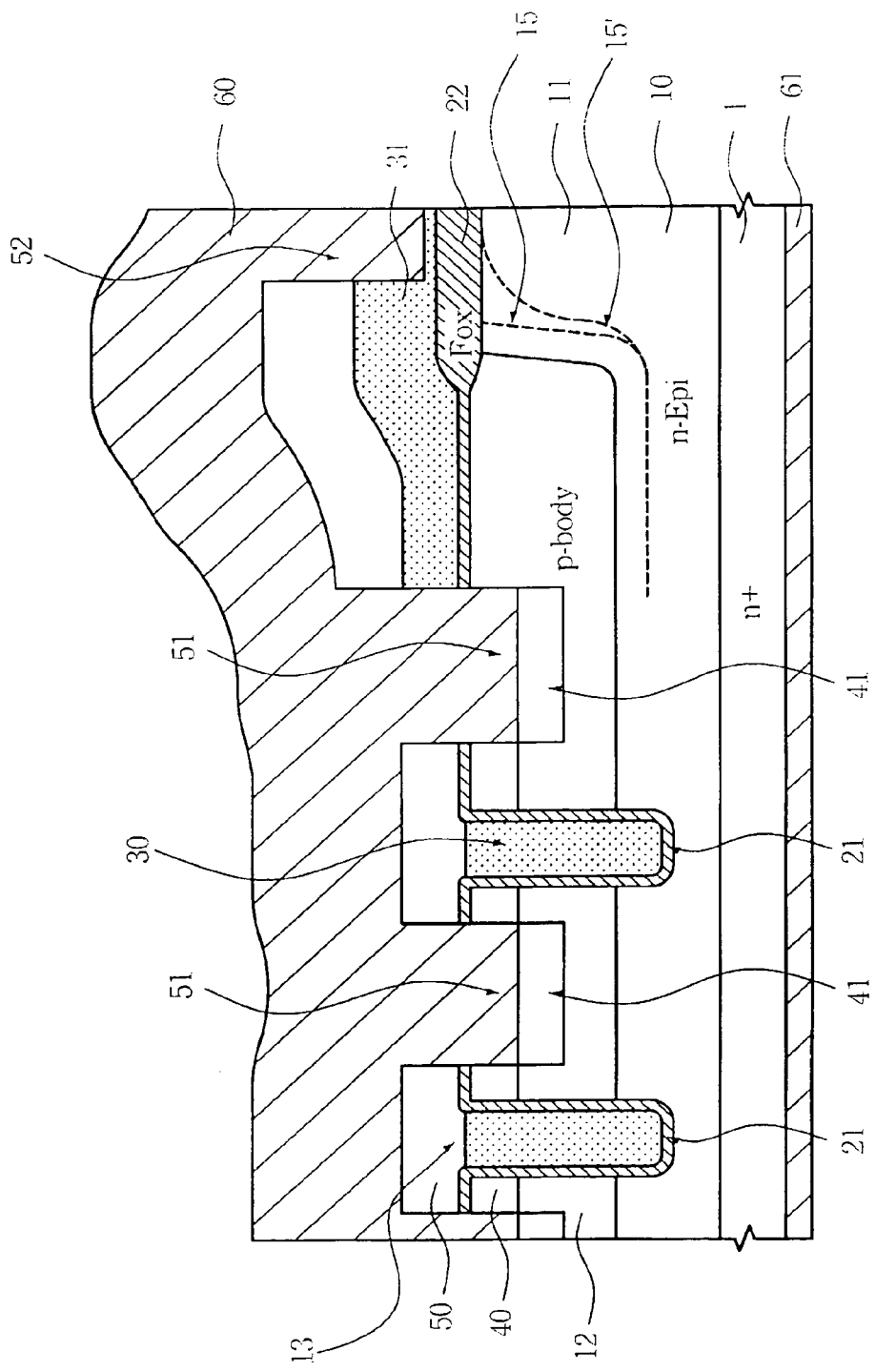
FIG. 6 is a schematic drawing of the termination structure in accordance with an embodiment of the present invention when applying an electric field thereto.

In addition, a sandwiched MOS structure of the termination structure polysilicon layer 31, the field oxide layer 22, and the epi layer 10 can function as an electric field plate. Referring to FIG. 6, a driving voltage applied to the termination structure of the present embodiment is illustrated. The metal contact layer 60 of source region is connected to the ground so that N+-type source region 40 and the termination structure polysilicon layer 31 are also connected to the ground. Meanwhile, the metal contact layer 61 of the drain region on the backside of the silicon substrate 1 is applied with a forward bias. Thus, the similar capacitance effect occurs between the termination structure polysilicon layer 31 and the underlying region of the epi layer 10. That is, negative charges gather in the bottom surface of the polysilicon layer 31, and positive charges gather in the corresponding top surface of the epi layer 10. It results in the 15-to-15' extension of the depletion region of the P-N junction between the field active area 12 and the termination region 11. Thus, the horizontal distance between the N+-type region 40b and the boundary of the active area 12 increases, so as to avoid electric breakdown.

Figure 7:
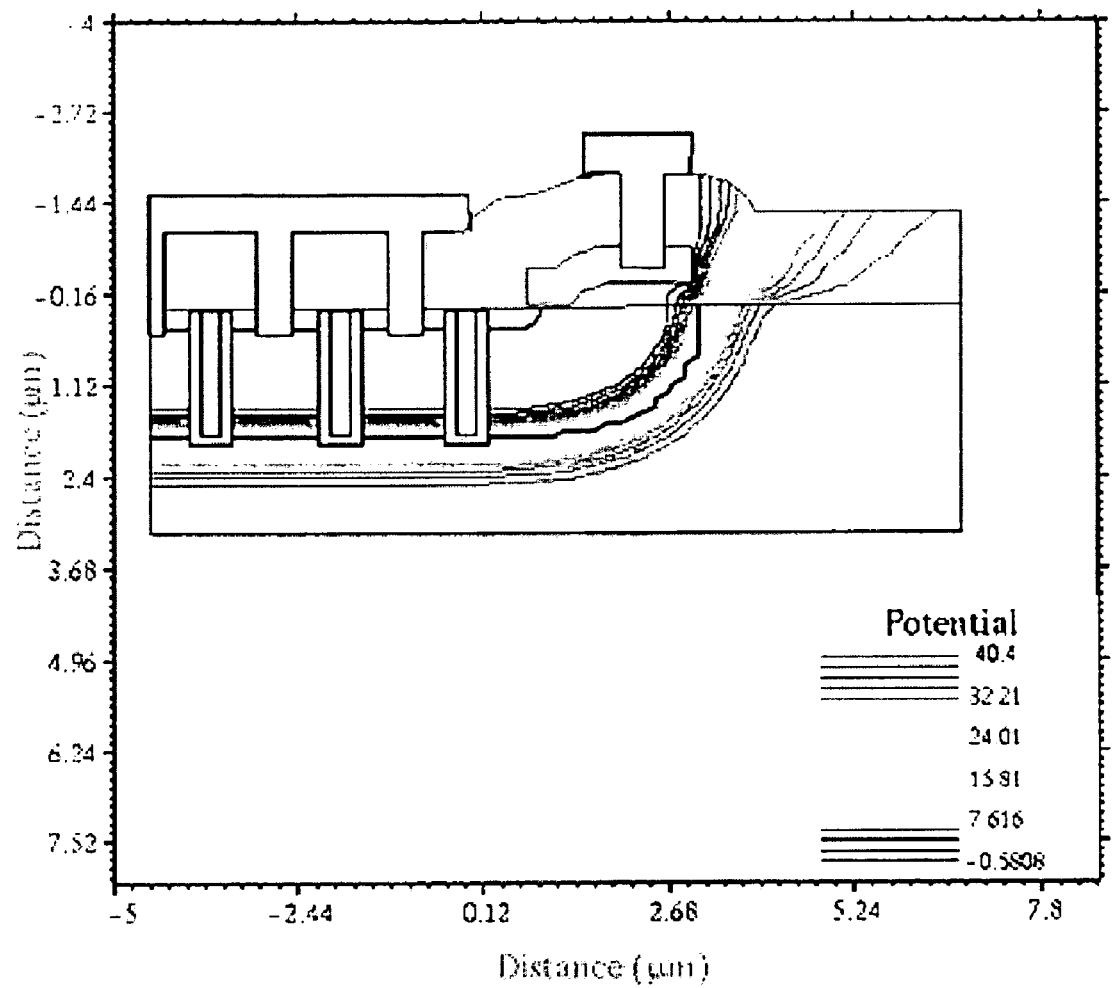
FIG. 7 depicts a computer simulation model of electric potential distribution of the termination structure in accordance with an embodiment of the present invention.

FIG. 7 shows a computer simulation result of equivalent electric field lines in the termination structure in accordance with the present embodiment. By adding the polysilicon layer 31 over the field oxide layer 22, the dense electric gradient region extends to the outside of the active region 12 and the equivalent electric field lines near cylinder-like P-N junction of the edge of the active area 12 become flat. Therefore, the density of electric field decreases to avoid early-happening electric breakdown.

Figure 8:
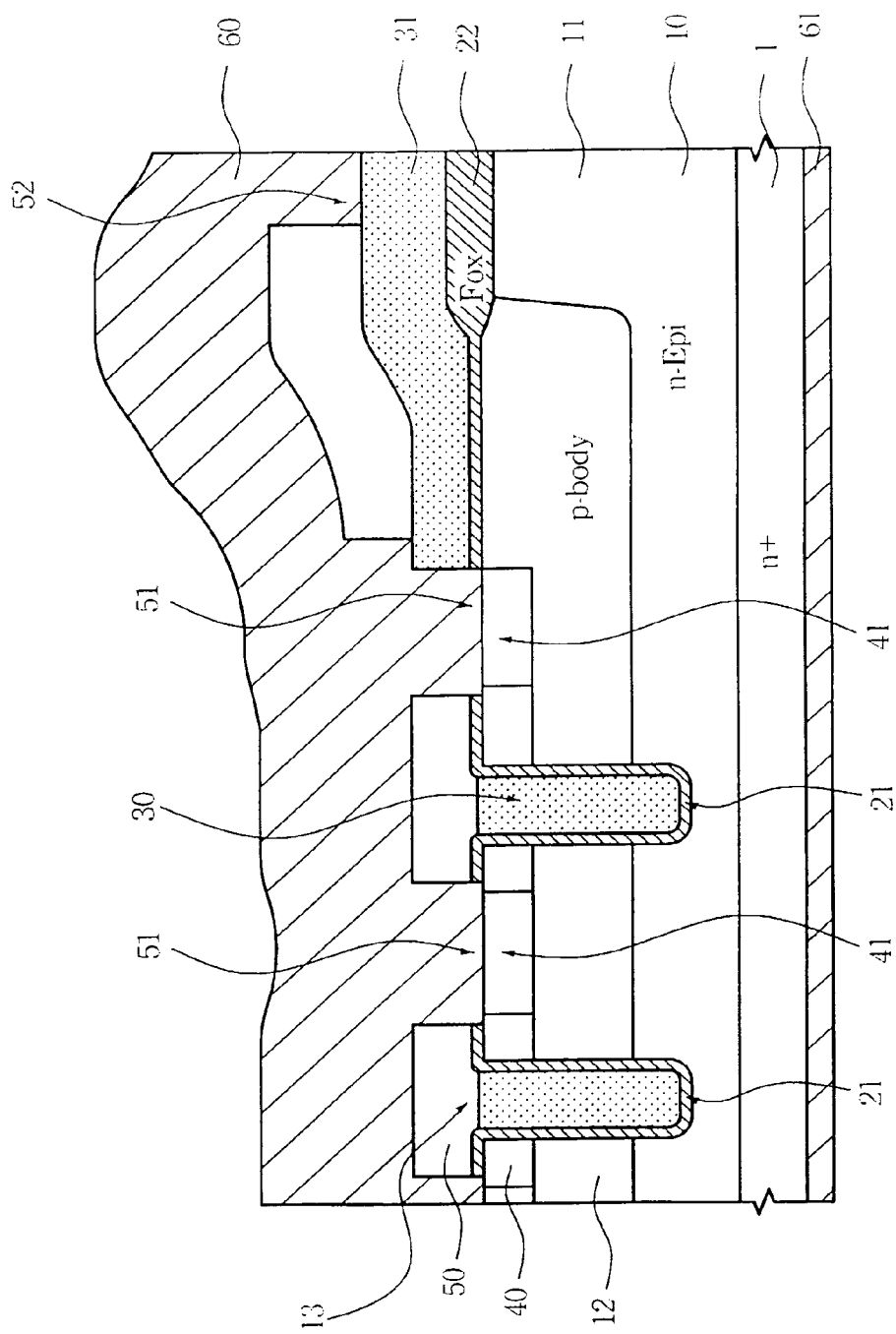
FIG. 8 is a schematic drawing of another embodiment of the trenched DMOS.

Another embodiment is shown in FIG. 8, which is based on the structure illustrated in FIG. 5D. In FIG. 5D showing some step, the anisotropic etching process is used to remove portions of the isolation layer 50 and the gate oxide layer 21. Thus, the contact windows 51 of the active area and the first contact window 52 are formed. The termination structure polysilicon layer 31 and the N+-type region 40b are used as an etching stop layer. Afterward, an implantation process of P+-type dopants is performed. The amount of P+-type ions implanted is large enough to change the electric property of the exposed N+-type region 40b to be P-type. Thus, the P+-type region 41 and the adjacent N+-type source region 40 are formed. The bottom of the P+-type region 41 underlies that of N+-type source region 40.

The above-described arrangements of apparatus and methods are merely illustrative of applications of the principles of this invention and many other embodiments and modifications may be made without departing from the spirit and scope of the invention as defined in the claims. For example, the shapes and sizes of the components that form the camera supporting device may be changed. The scope of the invention should, therefore, be determined not with reference to the above description, but instead should be determined with reference to the appended claims along with their full scope of equivalents.

What is claimed is:

1. A fabrication method of forming a trenched DMOS device and a termination structure thereof, the method comprising;

forming an N– epitaxial layer on an N+ silicon substrate;
forming an oxide layer on the N– epitaxial layer;
patterning the oxide layer to form a termination oxide layer therein to define an exposed active area of the DMOS device;
implanting P-type ions into the active area by using the termination oxide layer as a mask to form a P body in the N– epitaxial layer.
recessing the N– epitaxial layer to form a plurality of DMOS trenches in the P body by patterning and etching, the DMOS trenches having bottoms which extend beneath a bottom of the P body;
forming a gate oxide layer over exposed surfaces of the P body;
depositing a polysilicon layer over exposed surfaces and also filling the DMOS trenches;
recessing the polysilicon layer to form a plurality of polysilicon gates and a polysilicon plate by patterning and etching, wherein the polysilicon gates are positioned in the DMOS trenches and the polysilicon plate is positioned over the termination oxide layer and a portion of the gate oxide layer disposed adjacent the termination oxide layer;
implanting N-type ions into the P body by using the polysilicon plate and the termination oxide layer as a mask to form a plurality of N+ diffused regions;
forming an isolation layer over exposed surfaces after implanting the N-type ions;

patterning and anisotropically etching using a two-step etching process, the isolation layer and the gate oxide layer to form a plurality of body contact windows over the N+ diffused regions, and a first contact window over the polysilicon plate;

implanting P-type ions through the body contact windows to form a plurality of P+ diffused regions; and forming a source metal contact layer disposed over the isolation layer, and filling the body contact windows and the first contact window.

2. The method of claim 1, wherein the oxide layer on the N− epitaxial layer is formed by thermal oxidation.

3. The method of claim 1, wherein the gate oxide layer is formed over the exposed surfaces of the P body by thermal oxidation.

4. The method of claim 1, further comprising forming a drain metal contact layer on a back surface of the N+ silicon substrate.

5. The method of claim 4, further comprising removing unnecessary layers formed on the back surface of the N+ silicon substrate prior to forming the drain metal contact layer.

6. The method of claim 5, wherein the unnecessary layers formed on the back surface of the N+ silicon substrate are removed by chemical mechanical polishing.

7. The method of claim 1, further comprising forming a sacrificial oxide layer on the active area after forming the termination oxide layer.

8. The method of claim 6, further comprising removing the sacrificial oxide layer by etching after forming the DMOS trenches but before forming the gate oxide layer.

9. The method of claim 1, wherein the polysilicon plate comprises a portion extending toward one of the DMOS trenches disposed closest to the polysilicon plate.

10. The method of claim 1, wherein the two-step etching process for the isolation layer to form the body contact windows and the first contact window comprises:

removing portions of the isolation layer and the gate oxide layer by etching to form the body contact windows and the first contact window; and removing an exposed portion of the polysilicon plate at the first contact window, and removing an exposed portion of the N+ diffused regions at the body contact windows.

11. The method of claim 1, wherein patterning and anisotropically etching to form the body contact windows and the first contact window comprises removing the isolation layer and the gate oxide layer by etching while using the polysilicon plate and the N+ diffused regions as etch stop layers.

12. The method of claim 1, wherein implanting P-type ions through the body contact windows to form the plurality of P+ diffused regions comprises providing a sufficient dose of the P-type ions to change an electric polarity of the N+ diffused region exposed by the body contact windows to the P+ diffused regions.

13. The method of claim 1, wherein the isolation layer comprises doped silicate glass.

14. The method of claim 1, wherein the source metal contact layer comprises a stack of Ti, TiN, and AlSiCu alloy layers.

15. A method of forming a trenched DMOS device and a termination structure thereof, the method comprising:

providing an N+ silicon substrate, an N− epitaxial layer on the N+ silicon substrate, a termination oxide layer on the N− epitaxial layer, a P body in the N− epitaxial layer, a plurality of DMOS trenches extending through the P body into the N− epitaxial layer, and a gate oxide layer over exposed surfaces of the P body;

forming a trenched DMOS device having a plurality of polysilicon gates disposed in the DMOS trenches, and a polysilicon plate disposed over the termination oxide layer and over a portion of the gate oxide layer disposed adjacent the termination oxide layer;

implanting N-type ions into a portion of the P body not covered by the polysilicon plate and termination oxide layer to form a plurality of N+ diffused regions;

forming an isolation layer over exposed surfaces after implanting the N-type ions;

patterning and anisotropically etching using a two-step etching process, the isolation layer and the gate oxide layer to form a plurality of body contact windows over the N+ diffused regions, and a first contact window over the polysilicon plate;

implanting P-type ions through the body contact windows to form a plurality of P+ diffused regions; and forming a source metal contact layer over the isolation layer, and filling the body contact windows and the first contact window.

16. The method of claim 15, further comprising forming a drain metal contact layer on a back surface of the N+ silicon substrate.

17. The method of claim 15, wherein the polysilicon plate comprises a portion extending toward one of the DMOS trenches disposed closest to the polysilicon plate.

18. A method of forming a trenched DMOS device and a termination structure thereof simultaneously, the method comprising:

providing a silicon substrate with an epitaxial layer formed thereon, and a body region defined by doping the epitaxial layer;

selectively etching the body region to form a plurality of DMOS trenches therein;

forming a gate oxide layer over exposed surfaces in the body region and a termination oxide layer to cover the body region;

depositing a polysilicon layer over exposed surfaces;

selectively etching the polysilicon layer to form a plurality of polysilicon gates in the DMOS trenches and a polysilicon plate having an extending portion toward the body region over the termination oxide layer;

forming sources in the body region by using the polysilicon plate as a mask; and forming an isolation layer, patterning and anisotropically etching the isolation layer and the gate oxide layer using a two-step etching process, and then forming a source metal contact layer over exposed surfaces, the isolation layer protecting the polysilicon gates, the source metal contact layer grounding the body region and the polysilicon plate.

* * * * *